(12) United States Patent
Puotiniemi (10) Patent No.: US 6,316,996 B1
(45) Date of Patent: Nov. 13, 2001

(54) ADJUSTABLE AC LOAD STRUCTURE

(75) Inventor: Markku Puotiniemi, Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/427,130

(22) Filed: Oct. 25, 1999

(51) Int. Cl.[7] .................................................. H03F 3/45
(52) U.S. Cl. ................................... 330/254; 327/359
(58) Field of Search ........................... 330/85, 86, 110, 330/254, 285, 296; 327/359

(56) References Cited

U.S. PATENT DOCUMENTS 5,146,180 * 9/1992 Hyakutake .......................... 330/254
5,345,191 * 9/1994 Tanaka ................................ 330/85 X

* cited by examiner

*Primary Examiner*—Steven J. Mottola
(74) *Attorney, Agent, or Firm*—Perman & Green, LLP (57) ABSTRACT

An adjustable AC load structure comprising an AC output impedance circuit and a transistor bias control. The AC output impedance circuit provides an adjustable AC gain output. The transistor bias control is set to a desired bias on the AC output impedance circuit.

7 Claims, 7 Drawing Sheets

ADJUSTABLE AC LOAD STRUCTURE

BACKGROUND OF THE INVENTION

1. Field of the Invention

The present invention relates to AC loads and, more particularly, to adjustable AC loads.

2. Prior Art

Ordinarily, when a resistor load is used on the collector of a transistor, the DC potential on the collector and thus the DC-operating point, the AC gain, and the current through the transistor are not independent. This presents a problem when attempting to operate at low voltage when there is a simultaneous need for high gain, linear operation, optimized DC-current and optimized collector voltage.

SUMMARY OF THE INVENTION

In accordance with one embodiment of the present invention an adjustable AC load structure is provided. The AC load structure is comprised of an AC output impedance circuit and a transistor bias control. The AC output impedance circuit provides an adjustable AC gain output. The transistor bias control is set to a desired bias on the AC output impedance circuit.

In accordance with another embodiment of the present invention an adjustable AC load is provided as a circuit comprising a transistor, an amplifier section, a voltage coupling network, and a feedback network. The transistor is connected in parallel with an impedance, generally a resistor. The amplifier section is connected to the base of the transistor. The voltage coupling network is connected to an input of the amplifier section. The feedback network is connected between the transistor and an input of the amplifier section.

In accordance with one method of the present invention, a method for providing an adjustable AC transistor load to set the DC operating point of a collector of the transistor, an AC-gain of the transistor, and a current through the collector of the transistor, is provided. Comprising steps of; providing an impedance component in parallel with a transistor component; providing a bias control signal to the transistor component; providing an output differential amplifier to the bias control signal; providing a feedback path from a collector of the transistor through an impedance to the differential amplifier; and providing a voltage to an input terminal of the differential amplifier.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Although the present invention will be described with reference to several embodiments shown in the drawings, it should be understood that the present invention can be embodied in many alternate forms of embodiments. In addition, any suitable size, shape or type of elements or materials could be used.

Figure 1:
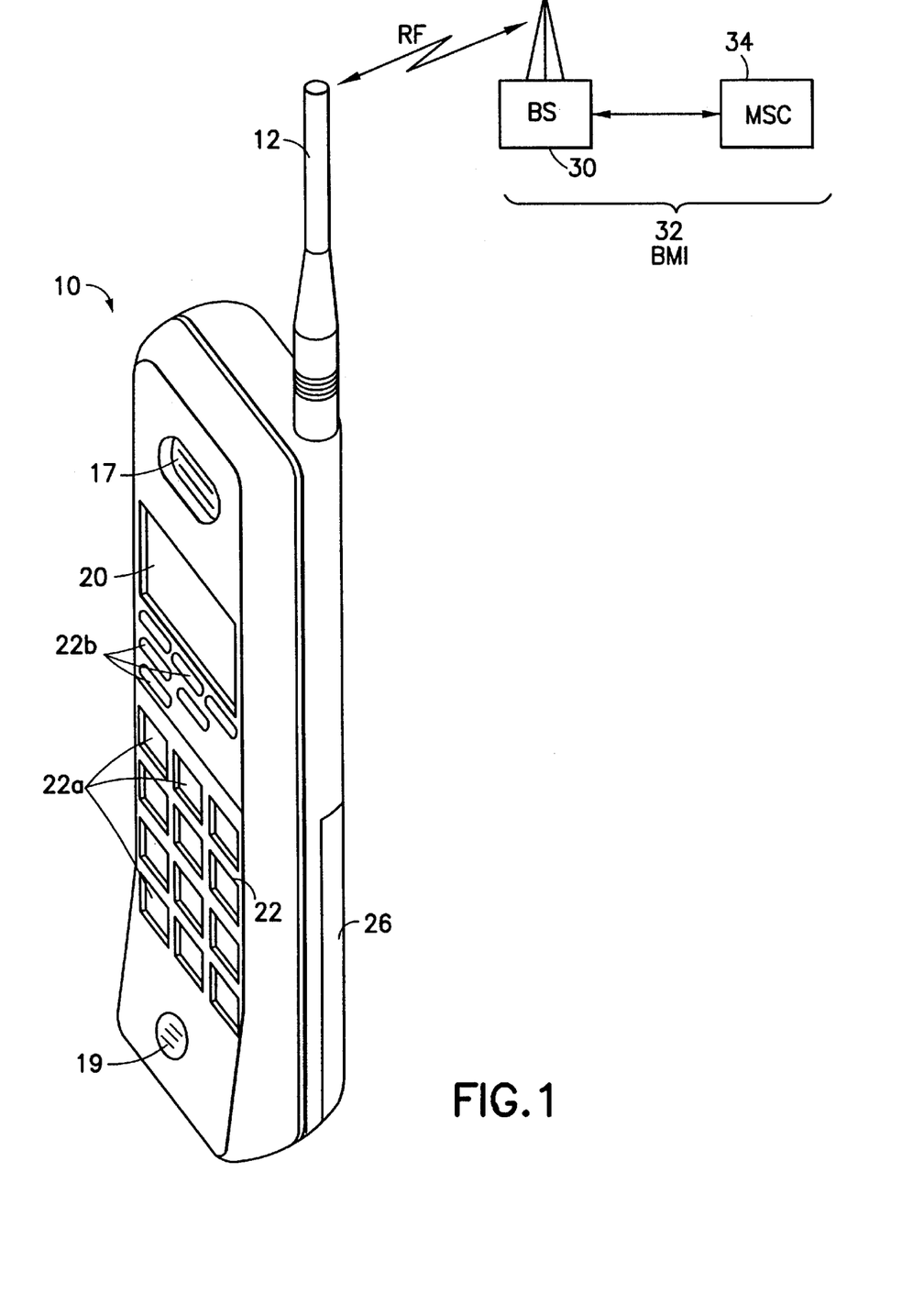
FIG. 1 is a perspective view of a mobile station and a cellular communication system to which the mobile station is bidirectionally coupled through a wireless RF link.
Figure 2:
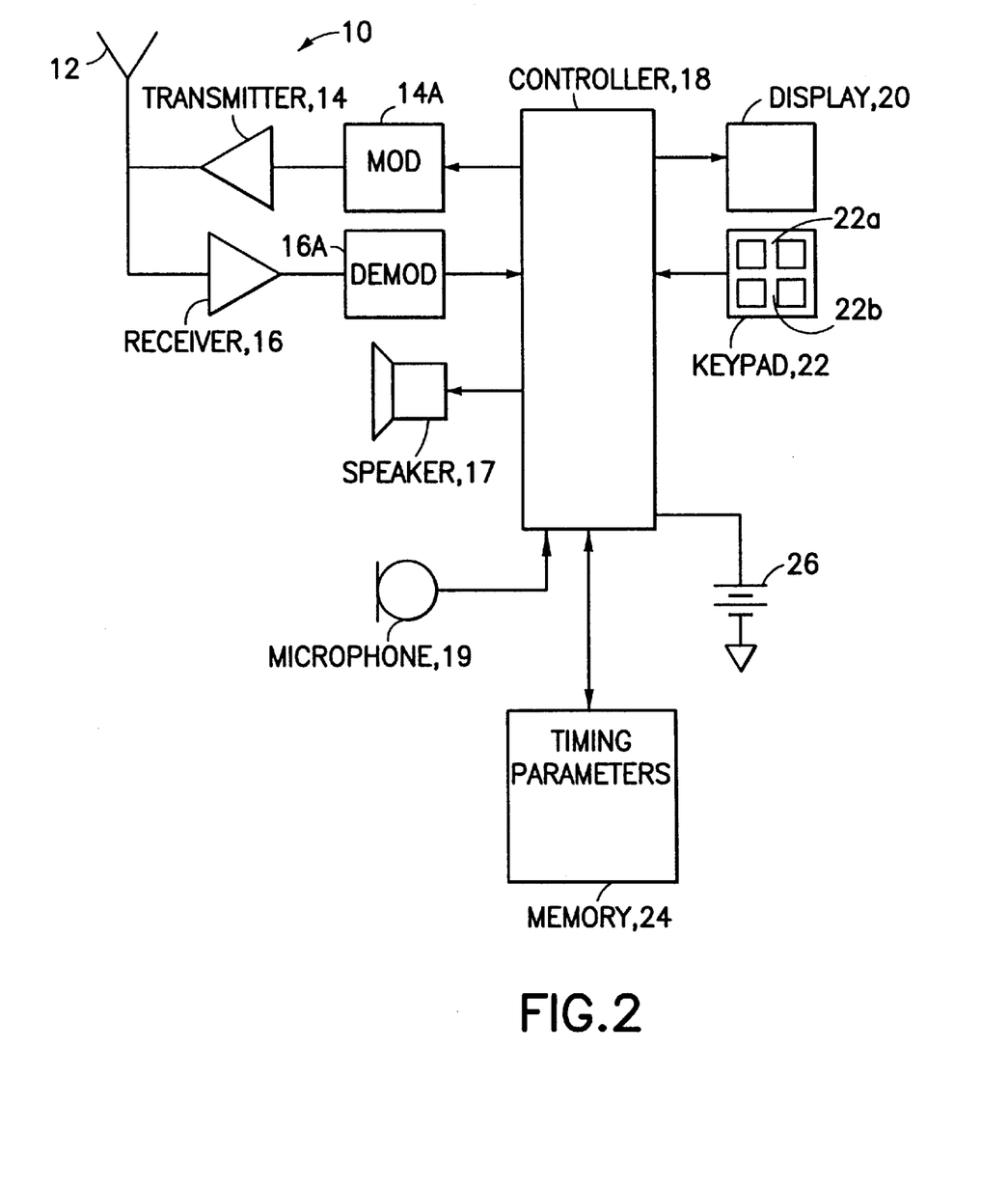
FIG. 2 is a block diagram of the mobile station shown in FIG. 1 that is constructed and operated in accordance with this invention.

Reference is first made to FIGS. 1 and 2 for illustrating a wireless user terminal or mobile station 10, such as but not limited to a cellular radio telephone or a personal communicator, that is suitable for practicing this invention. The mobile station 10 includes an antenna 12 for transmitting signals to and for receiving signals from a base site or base station 30, which is assumed to include a base station sub-system (BSS) as well as a base transceiver station (BTS). For simplicity, these two components are collectively referred to simply as the base station 30. The base station 30 is a part of a cellular network 32 that includes a mobile switching center (MSC) 34 or similar apparatus. The MSC 34 provides a connection to landline trunks when the mobile station 10 is involved in a call.

The mobile station includes a modulator (MOD) 14A, a transmitter 14, a receiver 16, a demodulator (DEMOD) 16A, and a controller 18 that provides signals to and receives signals from the transmitter 14 and receiver 16, respectively. These signals include signaling information in accordance with the air interface standard of the applicable cellular system, and also user speech and/or user generated data. The air interface standard is assumed for this invention to be based on TDMA such as is known from or that is similar to GSM, although the teaching of this invention is not intended to be limited only to that particular type of TDMA system. The present invention could be used with any suitable type of radio telephone system or suitable electronic device. With general regard to GSM mobile stations and networks, reference can be had to "The GSM System for Mobile Communications", by Michel Mouly and Marie-Bernadette Pautet, 1992, the disclosure of which is incorporated by reference in its entirety.

It is understood that the controller 18 also includes the circuitry required for implementing the audio and logic functions of the mobile station. By example, the controller 18 may be comprised of a digital signal processor device, a microprocessor device, and various analog to digital converters, digital to analog converters, and other support circuits. The control and signal processing functions of the mobile station are allocated between these devices according to their respective capabilities.

A user interface may include a conventional earphone or speaker 17, a conventional microphone 19, a display 20, and a user input device, typically a keypad 22, all of which are coupled to the controller 18. The keypad 22 includes the conventional numeric (0–9) and related keys (#, *) 22a, and other keys 22b used for operating the mobile station 10. These other keys 22b may include, by example, a SEND key, various menu scrolling and soft keys, and a PWR key. The mobile station 10 also includes a battery 26 for powering the various circuits that are required to operate the mobile station. The mobile station 10 also includes various memories, shown collectively as the memory 24, wherein are stored a plurality of constants and variables that are used by the controller 18 during the operation of the mobile station. Certain TDMA timing related parameters that are transmitted from the base station 30 to the mobile station 10 are typically stored in the memory 24 for use by the controller 18. It should be understood that the mobile station 10 can be vehicle mounted, handheld, or a stationary device. It should be further appreciated that the mobile station 10 can be capable of operating with one or more air interface standards, modulation types, and access types, and may thus be dual (or higher) mode device. It is understood that the receiver 16 also includes circuitry required for implementing the well known process of multiplying a bandpass signal by a periodic signal to obtain a new center frequency, i.e., mixing.

Figure 3:
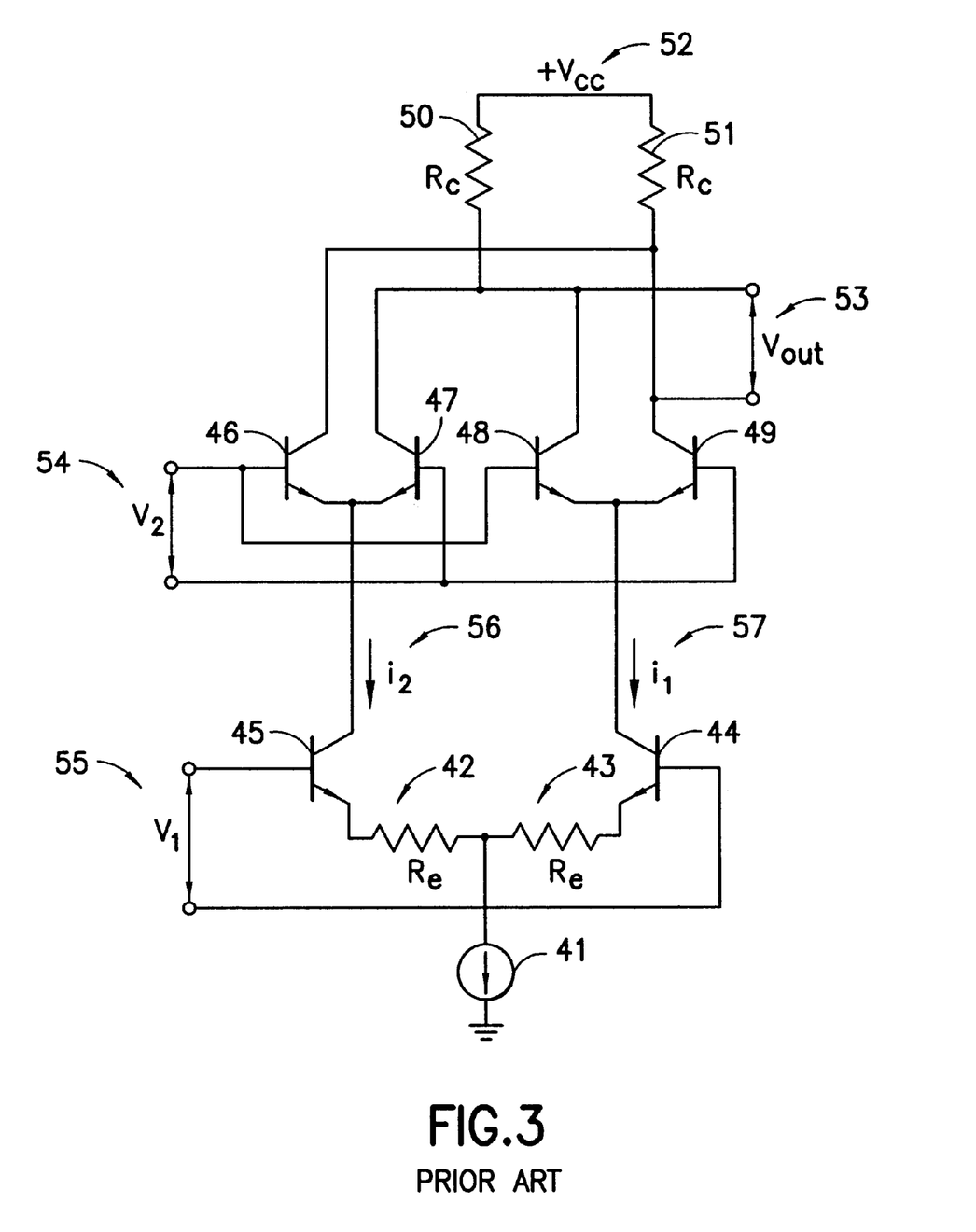
FIG. 3 is a circuit diagram of a typical double balanced mixer.

FIG. 3 shows a double balanced mixer, commonly known as a Gilbert cell mixer, with power supply 52. The two emitter coupled transistor pairs on the top 46–49 are variable gain differential amplifiers connected in a balanced structure so that if the dual transistor pairs 46–47 and 48–49 are assumed to perform as single pole, double throw switches, the currents 56–57 of the two outputs of the dual transistor pairs flows alternatively through the outer transistors 46,49 or through the inner transistors 47–48 depending on the local oscillator signal applied to input 54. The emitter currents, initially established by emitter resistors 42–43 and external current source 41, are varied differentially by the signal applied to the bottom pair of transistors 44–45 through input terminal 55. The collectors of outer transistors 46,49, are cross-coupled to the load resistors 50–51 while the collectors of the inner resistors 47–48 are connected directly to the load resistors 50–51. The result is mixed emitter currents 56–57 which are converted to a linear output voltage signal using load resistors 50–51. However, in practice the linear operating region of a simple mixer or Gilbert cell is not adequate because of the interdependency the DC operating point, the AC gain, and the current through either one of the transistor amplifiers 44–45 has on the selection of load resistors 50–51. This interdependency forces design trade off considerations when desiring the transistors 46–49 to amplify low input signal voltages, but remain within the linear operating region of the transistors 46–49.

Figure 4:
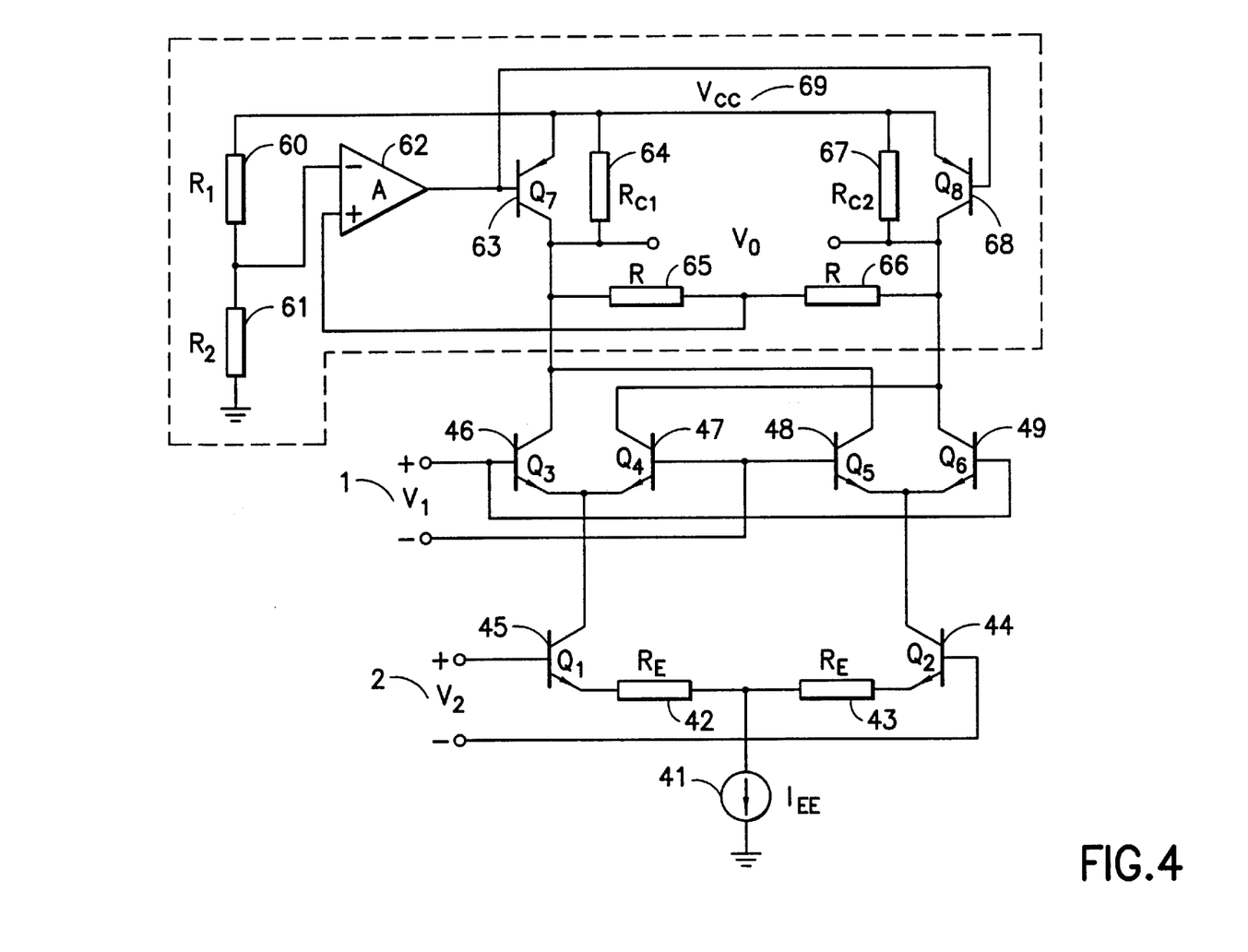
FIG. 4 is a circuit diagram of a mixer and dual adjustable AC loads illustrating one embodiment of this invention.

Referring now to FIG. 4, there is shown a double balanced mixer incorporating features of the present invention. Signals to be mixed are supplied via terminals 1 and 2. Resistors 60–61, amplifier 62, and transistors 63 and 68 set the desired DC-potential on transistors 63 and 68 collectors which does not depend on collector DC current of the transistors 63,68. Parallel combinations of transistors 63,68 output resistances and resistors 64,67 form the AC-load which sets the gain which is independent of transistors 63,68 collector DC current and collector DC potential (it is assumed that the output resistances of transistors 63 and 68 are much higher than resistors 64 and 67 resistances.) Resistors 65,66 provide DC feedback to the amplifier 62. Circuit voltage is supplied by an external power supply 69 and an external current source 41 provides current as shown.

Figure 5:
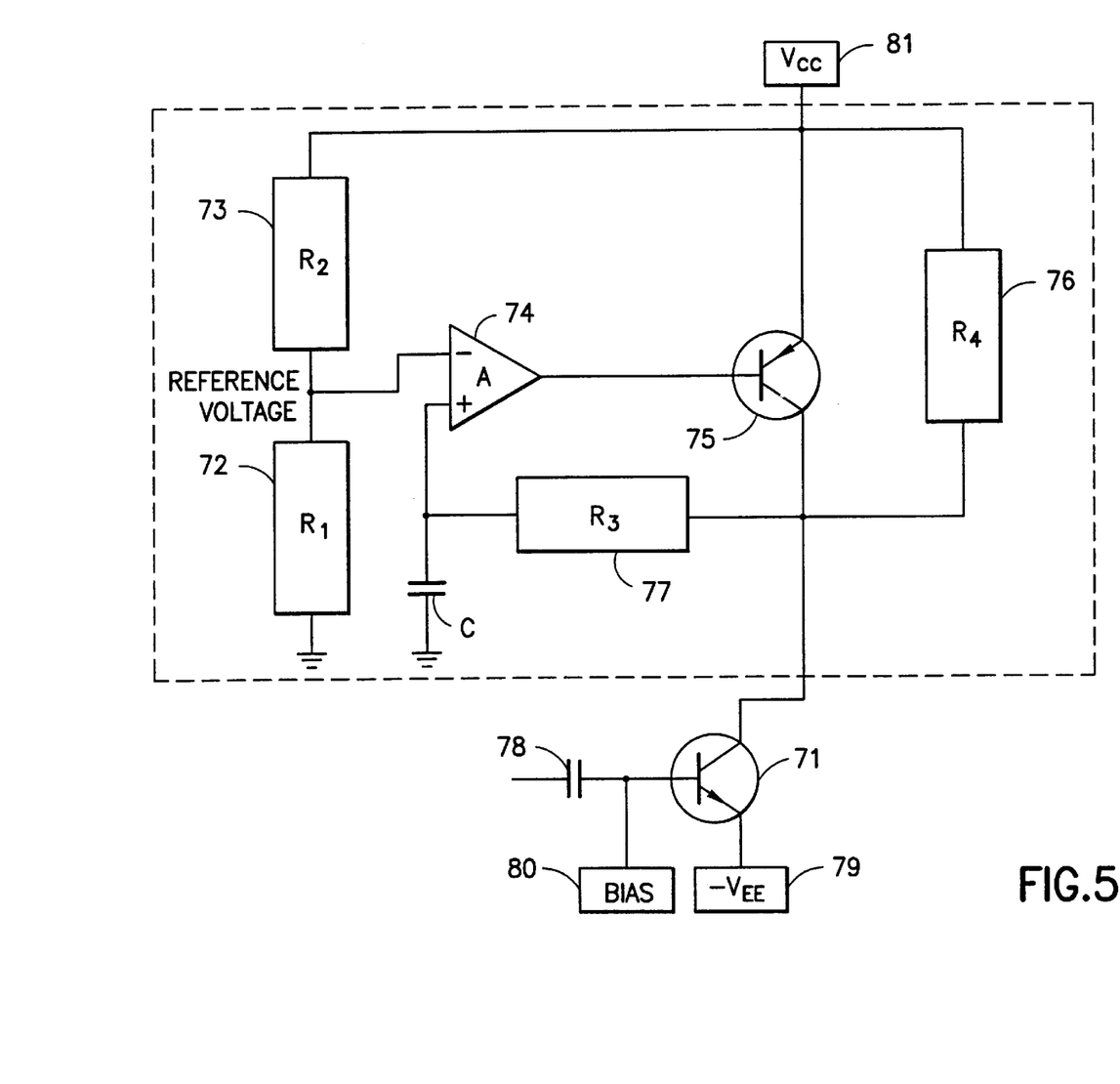
FIG. 5 is a circuit diagram of a transistor and an adjustable AC load illustrating a second embodiment of this invention.
Figure 6:
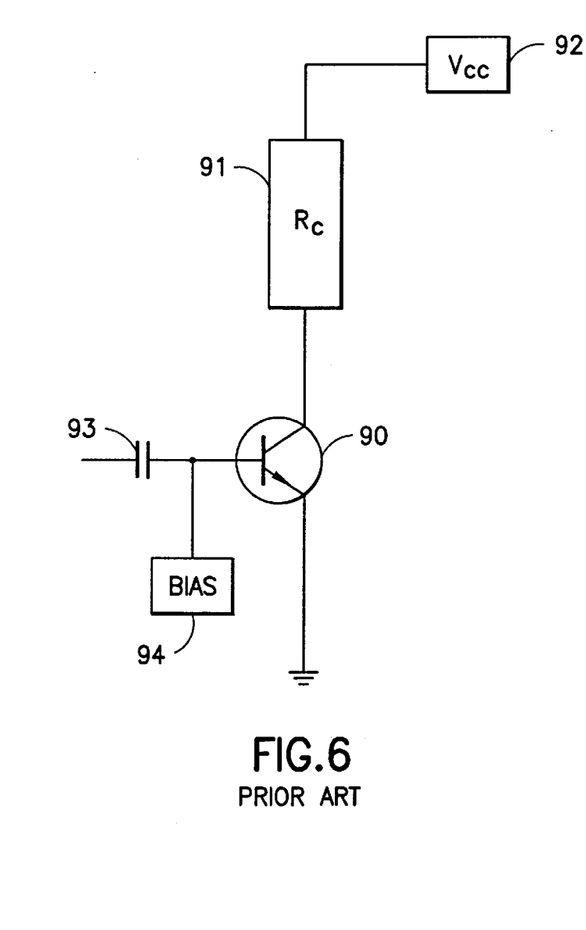
FIG. 6 is a circuit diagram of a typical transistor amplifier and collector load resistance.

Referring now to the common-emitter amplifier circuits shown in FIGS. 5 and 6. The dashed area in FIG. 5 shows a second embodiment of the present invention as claimed, replacing a typical fixed transistor collector resistance 91 as shown in FIG. 6. In general, the DC operating conditions of FIG. 6 are established by the transistor collector supply voltage 92, the transistor collector resistance 91, and a DC bias voltage 94 established on the transistor base 90.

Using Kirchhoff's voltage law to Examine the DC conditions of the collector circuit shown in FIG. 6 yields the following well known voltage equation:

$$V_{cc}=V_{ce}+I_cR_c$$

also known as the loadline equation. Note the dependency on $R_c$. The loadline equation is a first order equation which is typically represented by a straight line drawn through the collector characteristics for a particular transistor connected in a common emitter configuration. Two points on the line are found by setting limiting conditions on the collector circuit. For example, one point is located by setting $V_{ce}$, to 0 V. The loadline equation then reduces to $V_{cc}=I_cR_c$, and the maximum value the collector current can assume is $I_c(max)=V_c$. Again note the dependency on the resistor $R_c$. The second point is located by setting $I_c$ to 0 mA. The loadline equation then reduces to $V_{ce}=V_{cc}$ and the maximum value the collector can assume is $V_{ce}(max)=V_{cc}$. The two points are located on a graph of the transistor's characteristics and connected by a straight line, and referred to as the DC loadline. The quiescent or Q operating point is located along the DC loadline by selecting a transistor base biasing arrangement to produce the desired DC base current into the transistor 90. In general, the bias voltage 94 and hence the Q point, is selected to allow the input RF signal coupled through capacitor 93 and imposed on the DC base current to be amplified without distortion (i.e.: operate in the linear region of the transistor). The amplification or voltage gain of the input signal follows the formula: $A_v=(A_i*R_c)/r_i$, where $A_v$=voltage gain, $A_i$=current gain, $R_c$=resistance on the transistor collector, represented here by 91, and $r_i$=input resistance of the transistor 90. Again, note the dependency on the resistance $R_c$. It can be seen from the aforementioned dependencies on $R_c$ that certain tradeoffs must be made when designing a transistor amplifier circuit. For example a large transistor collector resistance 79 required for high gain would at the same time alter the DC operating conditions of the transistor circuit by altering the DC loadline such that small changes in transistor base current could produce distortion of the output signal.

Referring now to FIG. 5, there is shown a circuit incorporating features of the present invention. The DC potential on the collector of transistor 71 is set by resistors 72,73,77, amplifier 74, a capacitor C, an external voltage supply 81, and a PnP transistor 75. A DC reference voltage at the inverting input of amplifier 74 is adjusted by the voltage divider network 72–73 and the voltage supply 81 according to the formula: $V_-=V_{cc}(R_1/(R_1+R_2))$. The DC reference voltage is connected to the negative terminal of amplifier 74. Amplifier 74 turns on transistor 75 until the voltage at both input terminals of amplifier 75 is at the same potential, i.e., the reference DC voltage. Because the input terminals of the ideal amplifier do not draw current, there is no voltage drop across resistor 77 and the reference DC voltage appears on the collector of transistor 75. Capacitor C is selected to appear as a short to ground or zero potential for AC signals. Thus, the desired DC potential on the collector of transistor 71 is set by selecting the DC reference voltage and is independent of any AC signals that may be present. The DC potential appearing on the collector of transistor 71 does not depend on the resistance of resistor 76 because resistor 76 does not contribute to the generation of the DC potential. (It is assumed that transistor 75 operates in the normal transistor amplifier region.) The collector current of transistor 71 is determined by bias 80.

With the embodiment of the present invention shown in FIG. 5, The AC signal coupled by capacitor 78 and amplified by transistor 71 sees the output resistance of the PnP transistor 75 in parallel with resistance from resistor 76. Typically the output resistance of transistor 75 is very large in comparison to the parallel resistance from resistor 76. The AC signal effectively sees only the 76 resistance and the voltage gain follows the aforementioned formula with $R_c$ replaced by resistor 76. Thus, the present invention isolates the dependencies of the DC collector potential, collector current, and voltage gain on the selection of the output collector resistor 76. This minimizes the tradeoffs that must be made in the traditional amplifier circuit describe previously by simultaneously permitting high gain and linear operation when operating at low voltages.

Figure 7:
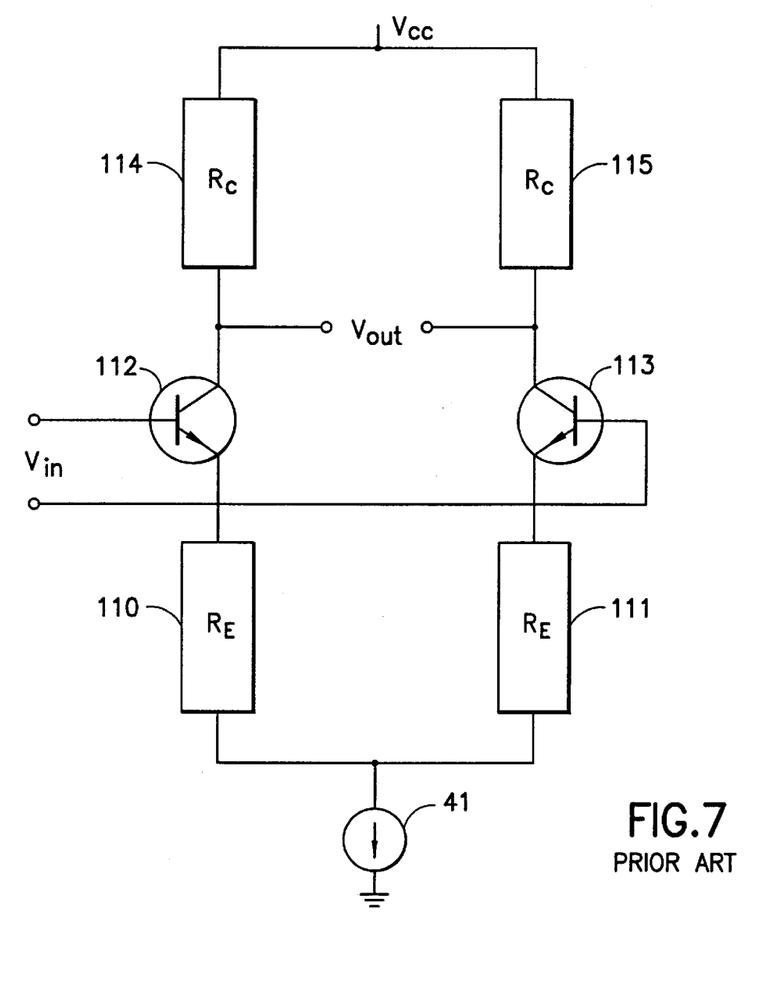
FIG. 7 is a circuit diagram of a typical differential transistor pair.

Refer now to FIG. 7. Differential pair AC voltage gain $A_v$ is determined by: $A_v = -R_c(R_E + r_e)$ $$A_v = -R_c \div (R_E + r_e),$$

Where $r_e$ is a resistance characteristic of transistors 112–113. As shown, gain is dependent upon $R_c$ represented here by resistors 114–115.

Figure 8:
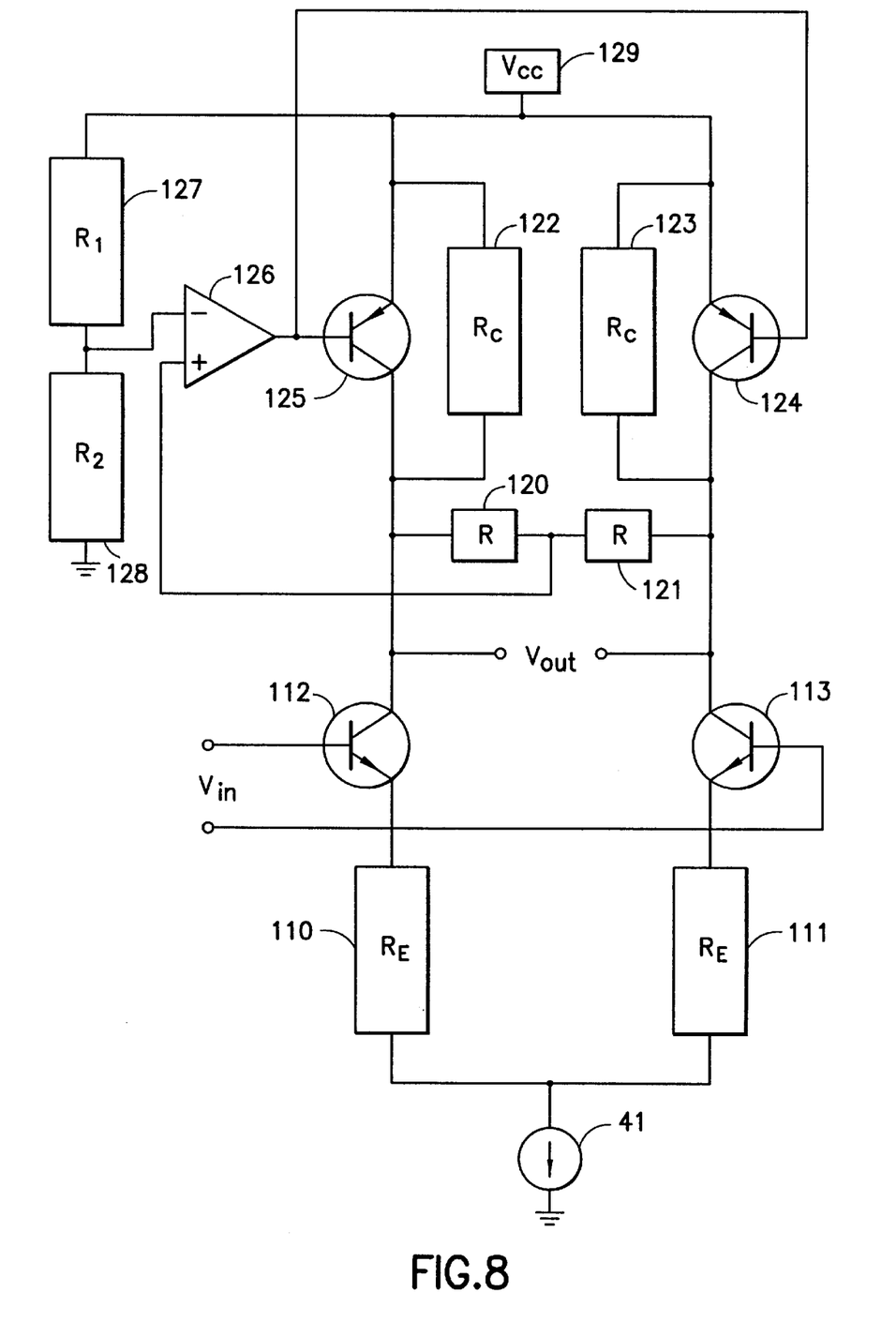
FIG. 8 is a circuit diagram of a differential pair of transistors and an adjustable AC load illustrating a third embodiment of this invention.

Now refer to FIG. 8 which presents a third embodiment of the present invention. FIG. 8 presents a differential pair and an adjustable AC-load where resistances $R_c$ are represented by resistors 122–123. The DC potential on the collectors of transistors 112–113 is set by resistors 127–128, amplifier 126, an external voltage supply 129, and PnP transistors 124–125. A DC reference voltage at the inverting input of amplifier 126 is adjusted by the voltage divider network 127–128 and the voltage supply 129 according to the formula: $V_{\_\_} = V_{cc}(R_1/(R_1+R_2))$, where $R_1$ and $R_2$ are represented here by resistors 127–128. The DC reference voltage is connected to the negative terminal of amplifier 126 and the DC feedback, taken from the juncture of resistors 120–121, is applied to the positive terminal. (The juncture of resistors 120–121 is a virtual ground to AC signals due to the nature of the differential pair and if both resistors have the same value.) Amplifier 126 turns on transistors 124–125 until the voltage at both input terminals of amplifier 126 are at the same potential, i.e., the DC reference voltage. Because the current drain at the input terminals of amplifier 126 is negligible, there is no appreciable voltage drop across resistors 120 or 121 and the DC voltage on the positive terminal of amplifier 126 is essentially equal to the DC voltage appearing on the collectors of transistors 112–113. Thus, the desired DC potential on the collectors of transistors 112–113 is set by selecting the DC reference voltage and is independent of any AC signals that may be present. The DC potentials appearing on the collectors of transistors 112–113 do not depend on the resistances of resistors 122–123 because resistors 122–123 do not contribute to the generation of the DC potential. It is assumed that the output resistance of transistors 124–125 is much higher than resistors 122–123 so that the resistance of the parallel combinations of the output resistances and resistors 122–123 is effectively resistance $R_c$. Thus, resistors 122–123 may be selected to set the AC voltage gain independent of DC operating considerations. The resistance of feedback resistors 120–121 is selected to be much greater that the resistance of resistors 122–123 so as not to affect the differential pair voltage gain. (It is assumed that transistors 124–125 operate in the normal transistor amplifier region.)

Referring again to FIG. 8. The collector currents through transistors 112–113 are dependent upon external current source 41, emitter resistors 110–111, and the bias on transistors 112–113 as previously described. However, it is possible to use the circuit without resistors 122–123. In this case the voltage gain of the differential amplifier is determined by parallel combinations of the output resistances of transistors 124–125 and feedback resistances 120–121. The AC signal effectively sees the output resistance of transistor 124 in parallel with resistor 121 and the output resistance of transistor 125 in parallel with resistance 120. The voltage gain follows the aforementioned differential pair AC voltage gain formula with $R_c$ replaced by the parallel resistance seen by the AC signal.

It should be understood that the foregoing description is only illustrative of the invention. Various alternatives and modifications can be devised by those skilled in the art without departing from the invention. For example., the fixed voltage divider network shown in FIG. 5A 72,73 could be replaced by a potentiometer. Likewise, the PnP transistor 75 shown in FIG. 5A could be replaced by a Pmos transistor. In addition, PnP transistors could also be replaced by NpN transistors. In this case, the reference voltage is at the non-inverting input of the amplifier 74 and the feedback network is connected to the inverting input of the amplifier 74. Accordingly, the present invention is intended to embrace all such alternatives, modifications and variances which fall within the scope of the appended claims.

What is claimed is:

1. An adjustable AC load structure comprising:
   an AC output impedance circuit providing an adjustable AC gain output, wherein the AC output impedance circuit comprises:
   at least one first composite impedance, the at least one first composite impedance comprising:
   a first active device;
   a first passive device, the first passive device connected in parallel with the first active device;
   at least one second composite impedance connected in parallel with the at least one first composite impedance, the at least one second composite impedance comprising:
   a second active device;
   a second passive device, the second passive device connected in parallel with the second active device;
   a transistor bias control to set a desired bias on the AC output impedance circuit.

2. An adjustable AC load structure according to claim 1 wherein the transistor bias control further comprises:
   a signal comparator having first and second input terminals, and an output terminal connected to the AC output impedance circuit;
   a signal coupler connected to the output of the AC output impedance circuit and to the signal comparator;
   a signal coupler connected to a voltage source and to the signal comparator.

3. An adjustable AC load structure according to claim 2, wherein the signal comparator further comprises a differential amplifier with positive and negative input terminals and an output terminal wherein the differential amplifier amplifies the difference between signals applied to the first and second terminals thereof to provide a difference signal on the output terminal.

4. An adjustable AC load structure according to claim 2, wherein the signal coupler connected to the output of the AC output impedance circuit further comprises a feedback signal developed across an impedance connected to the output of the AC output impedance circuit and to the first terminal of the signal comparator.

5. An adjustable AC load structure according to claim 2, wherein the signal coupler connected to a voltage source further comprises a reference voltage developed across an impedance connected to a voltage source and to the second terminal of the signal comparator.

6. An adjustable AC load structure comprising:
   an AC output impedance circuit providing an adjustable AC gain output, wherein the AC output impedance circuit comprises:
      an impedance connected in parallel with a transistor device wherein;
      an emitter of the transistor device is connected to a voltage source;
      a base of the transistor device is connected to the transistor bias control;
      a collector of the transistor device is connected to a signal coupler connected to the output of the AC output impedance circuit and to the signal comparator;
   a transistor bias control to set a desired bias on the AC output impedance circuit, wherein the transistor bias control comprises:
      a signal comparator having first and second input terminals, and an output terminal connected to the AC output impedance circuit;
      a signal coupler connected to the output of the AC output impedance circuit and to the signal comparator; and
      a signal coupler connected to a voltage source and to the signal comparator.

7. A method for providing an adjustable AC transistor load in a cellular radiotelephone frequency mixer to set the DC operating point of a collector of a first transistor, an AC-gain of the first transistor, and a current through the collector of the first transistor, and to set the DC operating point of a collector of a third transistor, an AC-gain of the third transistor, and a current through the collector of the third transistor, the method comprising steps of:
   providing an impedance component in parallel with a second transistor component;
   providing a bias control signal to the second transistor component;
   providing a differential amplifier output as the bias control signal;
   providing a feedback path from a collector of the second transistor through a feedback impedance to a differential amplifier;
   providing a reference voltage to an input terminal of the differential amplifier;
   providing a second parallel impedance component in parallel with a fourth transistor component;
   providing a bias control signal to the fourth transistor component;
   providing the differential amplifier output as the bias control signal; and
   providing a second feedback path from a collector of the fourth transistor through a second impedance to the differential amplifier.

* * * * *